United States Patent [19]

Allardyce et al.

[11] Patent Number: 5,528,000
[45] Date of Patent: Jun. 18, 1996

[54] ELECTROPLATING PROCESS AND COMPOSITION

[75] Inventors: George R. Allardyce, Nuneaton; Kevin Bass, Loughborough; John E. Graves, Nuneaton, all of United Kingdom; James G. Shelnut, Northborough, Mass.

[73] Assignee: Shipley Company, L.L.C., Marlborough, Mass.

[21] Appl. No.: 395,685

[22] Filed: Feb. 28, 1995

Related U.S. Application Data

[62] Division of Ser. No. 108,976, Aug. 18, 1993, Pat. No. 5,415,762.

[51] Int. Cl.$^6$ .................................................... H05K 1/09
[52] U.S. Cl. .................. 174/266; 174/262; 174/257; 361/751
[58] Field of Search ................................. 174/262, 265, 174/266, 264, 256, 257; 361/751

[56] References Cited

U.S. PATENT DOCUMENTS

| | | | |
|---|---|---|---|
| 5,106,473 | 4/1992 | Witlaw et al. | 205/150 |
| 5,183,552 | 2/1993 | Bressel et al. | 205/158 |
| 5,194,313 | 3/1993 | Hupe et al. | 428/137 |
| 5,300,208 | 4/1994 | Angelopoulos et al. | 205/50 |
| 5,356,511 | 10/1994 | Hossel et al. | 156/629 |
| 5,368,717 | 11/1994 | Gottesfeld et al. | 205/98 |
| 5,403,467 | 4/1995 | Jonas et al. | 205/125 |
| 5,427,841 | 6/1995 | De Leeuw et al. | 428/209 |

*Primary Examiner*—Laura Thomas
*Attorney, Agent, or Firm*—Robert L. Goldberg

[57] ABSTRACT

A process for electroplating a nonconducting substrate comprising formation of a film of a conductive polymer on the surface of a nonconducting substrate and electrolytic deposition of metal thereover. The conductive film is formed by deposition of the conductive polymer onto said surface from an aqueous suspension of said polymer.

6 Claims, 1 Drawing Sheet

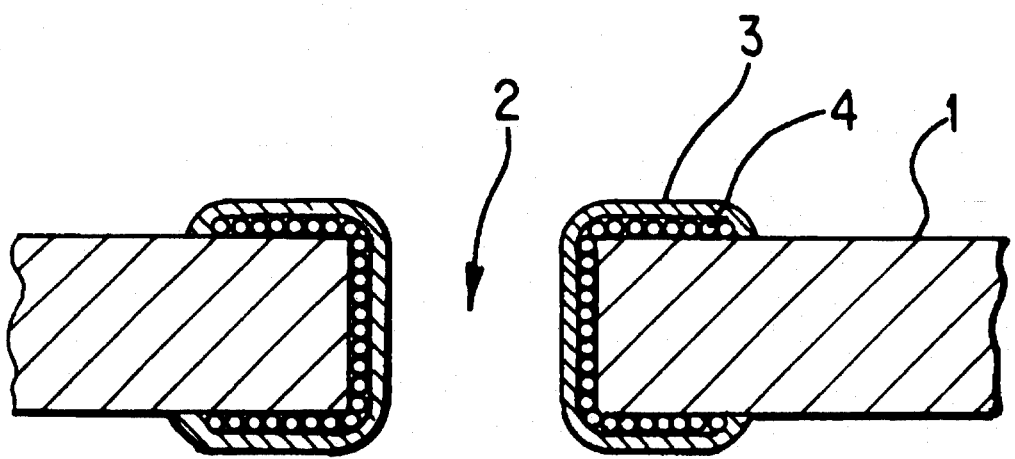

ELECTROPLATING PROCESS AND COMPOSITION

This is a divisional of application Ser. No. 08/108,976 filed on Aug. 18, 1993 now U.S. Pat. No. 5,415,762.

BACKGROUND OF THE INVENTION

I. Introduction

This invention relates to electroplating nonconductors, and more particularly, to processes and compositions for electroplating the surface of a nonconductor using a preformed suspension of a conductive polymer that, when adsorbed onto a nonconducting surface, functions as a base for direct electroplating. The invention is especially useful for the manufacture of electronic devices such as printed circuit boards.

II. Description of the Prior Art

Nonconductor surfaces are conventionally metallized by a sequence of steps comprising catalysis of the surface of the nonconductor to render the same catalytic to electroless metal deposition followed by contact of said catalyzed surface with a plating solution that deposits metal over the catalyzed surface in the absence of an external source of electricity. Metal plating continues for a time sufficient to form a metal deposit of the desired thickness. Following electroless metal deposition, the electroless metal deposit is optionally reinforced by electrodeposition of a metal over the electroless metal coating to obtain a desired thickness.

Catalyst compositions useful for electroless metal plating are known in the art. A typical catalyst composition consists of an aqueous colloid of a noble metal such as palladium. Electroless plating solutions are aqueous solutions containing both a dissolved metal and a reducing agent in solution. The presence of the dissolved metal and reducing agent together in solution results in plate-out of metal in contact with a catalytic surface. However, the presence of the dissolved metal and reducing agent together in solution can also result in solution instability and indiscriminate deposition of metal on the walls of containers for such plating solutions. In addition, such plating solutions utilize a complexing agent to hold the metal dissolved in solution. Complexing agents are difficult to waste treat. The reducing agent for such solutions is typically formaldehyde. Formaldehyde is toxic and subject to environmental regulations.

For the aforesaid reasons, attempts have been made to avoid use of an electroless plating solution by the practice of a direct plating process whereby a metal may be deposited directly onto a substrate treated to render the same semiconductive. One such process is disclosed in U.S. Pat. No. 3,099,608, incorporated herein by reference. The process of this patent involves treatment of nonconductive surface with a palladium colloid which forms a semi-conductive film of colloidal palladium particles over the nonconductive surface. For reasons not fully understood, it is possible to electroplate directly over the catalyzed surface of the nonconductor from an electroplating solution though deposition occurs by propagation and growth from a conductive surface. The deposit grows epitaxially along the catalyzed surface from this interface. For this reason, metal deposition onto the substrate using this process is slow. Moreover, deposit thickness may be uneven with the thickest deposit occurring at the interface with the conductive surface and the thinnest deposit occurring at a point most remote from the interface.

U.K. Patent. No. 2,123,036 B, incorporated herein by reference, is said to disclose an improvement to the above-described process. In accordance with the process of this patent, a surface is provided with metallic sites and said surface is electroplated from an electroplating solution containing an additive that is described by the patentee as inhibiting deposition of metal on metallic surfaces without inhibiting deposition on the metallic sites over the nonconductive surface. In this way, there is said to be preferential deposition over the metallic sites with a concomitant increase in the overall plating rate. In accordance with the patent, the metallic sites are preferably formed in the same manner as in the aforesaid U.S. Pat. No. 3,099,608—i.e., by immersion of the nonconductive surface in a solution of a tin-palladium colloid. The additive in the electroplating solution responsible for inhibiting deposition is described as one selected from a group of dyes, surfactants, chelating agents, brighteners and leveling agents. Many of such materials are conventional additives for electroplating solutions.

Further improvements in processes for the direct electroplating of nonconductors are disclosed in U.S. Pat. Nos. 4,895,739; 4,919,768 and 4,952,286, all incorporated herein by reference. In accordance with the processes of these patents, an electroless plating catalyst is treated with an aqueous solution of a chalcogen, such as a sulfur solution, to convert the catalytic surface to a chalcogenide. By conversion of the surface to the chalcogenide, greater conductivity is achieved and faster plating rates are possible.

The processes claimed in the aforementioned patents provide a substantial improvement over the process described in the U.K. Patent. However, it has also been found that treatment of an adsorbed catalytic metal over a nonconductor with a solution of a chalcogenide, especially a sulfide solution, results in a formation of a chalcogenide on all metal surfaces in contact with the solution of the chalcogen. Therefore, if the process is used in the manufacture of printed circuit boards, the copper cladding or conductors of the printed circuit board base material are converted to the chalcogenide together with the catalytic metal. If the chalcogenide of the copper is not removed prior to plating, it can reduce the bond strength between the copper and a subsequently deposited metal over the copper.

A further advance in the direct plating of the surfaces of nonconductors is disclosed in published European Application No. 0 520 195, incorporated herein by reference. In accordance with the invention described therein, a stable colloidal solution of a preformed catalytic chalcogenide is prepared and a surface is then contacted with the colloidal composition whereby the colloidal chalcogenide adsorbs on said surface. Thereafter, the nonconductor may be electroplated following procedures disclosed in the aforesaid U.S. Pat. Nos. 4,895,739; 4,919,768 and 4,952,286.

An alternative direct plate process is disclosed in PCT published application No. 89/00204, incorporated herein by reference. In accordance with the process of said published application, the surface of a substrate is pretreated with a solution having an oxidizing capability, removed from said solution and rinsed, introduced into a solution containing a monomer such as a pyrrole, furane, thiophene or its derivatives, which in a polymeric or copolymeric form is electrically conductive; the surface is then transferred into an acidic solution whereby an electrically conductive polymer layer, such as polymerized or copolymerized pyrrole, furane, thiophene or derivative is formed, residual solution is removed by rinsing and the coating formed over the substrate is then semiconductive and capable of direct electroplating. In accordance with this process, the oxidative pretreatment solution contains salts of permanganate, manganate, periodate and/or cerium IV. The monomer is present in a suitable solvent in an amount of from 5 to 35% by weight. The substrate is immersed in the monomer solution for a time ranging from about several seconds to 20 minutes. Room temperature treatment is satisfactory. The solution used to activate the monomer may contain an oxidative substance such as alkali metal persulfate, alkali metal peroxydisulfate, hydrogen peroxide, an iron salt such as ferric chloride, alkali metal periodates or similar compounds in acidic solution. A solution containing an active oxidizing agent in an amount of from 25 to 75 grams per liter of solution is usually considered satisfactory. Treatment can be at room temperature with immersion times of from 1 to 10 minutes and treatment is complete when a dark brown or black coloration is formed on the surface of the substrate. Difficulties encountered with this procedure include incomplete coverage of glass fibers and or epoxy on FR4 epoxide/glass printed circuit board substrate which can lead to discontinuities in the coating and the use of volatile organic compounds in the process sequence which may be toxic.

A modification to the above process is disclosed by Gottsfeld et al, *J. Electrochem. Soc.*, Vol. 139, No. 1, January 1992, pp. 14–15. In this process, a substrate to be plated is immersed directly into a solution of the oxidant and the monomer is then added to the solution to cause in situ formation of polymer in the presence of the substrate. Disadvantages to this process include the formation of polymer on all surfaces in contact with the solution—i.e., the container walls as well as the substrate, a limited life of the treatment solution and possible monomer toxicity.

SUMMARY OF THE INVENTION

The present invention provides a new method for direct electroplating of nonconducting surfaces using an aqueous or semi-aqueous suspension of a conductive polymer. The suspension may be in the form of a colloid or emulsion dependent upon the physical form of the conductive polymer. Using circuit board fabrication for purposes of illustration, the first step in the process comprises preparation of the circuit board substrate for plating. This includes the formation of through-holes, desmearing of the hole walls, conditioning the hole walls to improve adhesion and etching of the copper cladding to clean the same. Thereafter, the substrate is contacted with the suspension of the conductive polymer. The suspension is preferably formulated to be attracted to the conditioned dielectric surfaces. Thereafter, the substrate is electroplated in conventional manner.

Any conductive polymer suitable for suspension in aqueous or semi-aqueous media may be used for purposes of the invention. Preferred conductive polymers include polypyrrole, polyaniline and polythiophene and derivatives thereof.

The process of the invention is an improvement over earlier processes for plating nonconductors, especially those relying upon formation of a conductive organic polymer in situ over the substrate as there are fewer processing steps and volatile organics are eliminated from the process solutions.

DESCRIPTION OF THE DRAWING

The drawing illustrates a section of a printed circuit board prepared in accordance with the invention.

DESCRIPTION OF THE PREFERRED EMBODIMENTS

The process of the subject invention is suitable for manufacture of a variety of commercial articles where a metal deposit is desired over the surface of a nonconductor. However, the invention is especially useful for the fabrication of printed circuit boards. For this reason, the description that follows is directed primarily to printed circuit board fabrication.

As aforesaid, the invention described herein involves the use of a preformed suspension of a conductive polymer that is adsorbed onto the dielectric surface of a part to be plated. The following describes specific methods for formation of suspensions of conductive polymers suitable for purposes of the invention, but the following description should not be construed as limiting the scope of the invention to the specific suspensions discussed.

Colloidal Polyaniline

A method for formation of colloids of polyaniline is disclosed by Gill et al, "Novel Colloidal Polyaniline—Silica Composites," *J. P. Chem. Soc., Chem. Commun.*, 1992, pp. 108 and 109, incorporated herein by reference. In accordance with the procedures of this reference, colloidal silica is admixed with an acidic solution of an ammonium persulfate oxidant. Aniline is then added to the solution and stirred for an extended time during which time the aniline polymerizes onto the suspended silica particles. The polyaniline coated silica particles are then collected by centrifugation and redispersed. Films formed from these colloids are reported to have conductivities of from about 0.2 to 2.8 S $cm^{-1}$.

An alternative procedure for the formation of polyaniline colloids is disclosed by DeArmitt et al, "Synthesis Of Novel Polyaniline Colloids Using Chemically Grafted Poly(N-vinyl pyrrolidone)—Base Stabilizers," *Journal of Colloid and Interface Science*, Vol. 150, No. 1, 1992, pp. 134–142, incorporated herein by reference. The procedure of this reference comprises synthesis of colloids of aniline by graft copolymerization of aniline onto poly(N-vinyl pyrrolidone). The procedure comprises the bulk free-radical copolymerization of N-vinyl pyrrolidone and 4-aminostyrene using 2,2'-azobisiso-butyronitrile. The aniline copolymer is then formed by dissolving an oxidant such as ammonium persulfate and the copolymer in hydrochloric acid solution. Aniline monomer is then injected into the reaction mixture and stirred for an extended period of time resulting in the formation of dark green dispersions capable of separation by ultracentrifugation. Following separation, the particulate material may be redispersed as desired. The resulting colloid has particles that are spherical and varying in diameter between 50 and 400 nm with conductivities reported to be about 0.1 S $cm^{-1}$. A similar procedure is taught by Bay et al, "Poly(1-vinylimidazole-co-4-aminostyrene): Steric Stabilizer For Polyaniline Colloids," *Polymer*, 1991, Vol. 32, No. 13, pp. 2456–2460, also incorporated herein by reference. The procedure of Bay et al is similar to the procedure of DeArmitt except for the copolymer upon which the aniline is grafted.

Polypyrrole Suspensions

The preparation of colloids of polypyrrole is disclosed by Armes et al, "Preparation and Characterization of Colloidal Dispersions of Polypyrrole Using Poly(2-vinylpyridine)-based Steric Stabilizers," *Polymer*, 1990, Vol. 31, March, pp 569–574, incorporated herein by reference. The process utilized by Armes comprises formation of an aqueous solution of pyrrole, poly(2-vinylpyridine) and ferric chloride added as an oxidant. The mixture is allowed to react over an extended period of time and the colloidal product formed is separated by ultracentrifugation. The sediment is recovered and redispersed. The colloidal particles formed were found to have a particle size ranging between about 130 and 200 nm. Further details for the formation of polymers using the method described by Armes can be found in U.S. Pat. No. 4,959, 162, incorporated herein by reference.

In accordance with the invention, the above-described procedures for the formation of a suspension of a conductive polymer may be modified by elimination of the steps of collecting the suspended particles and redispersing the same in an acid solution. To eliminate the redispersion step, it is desirable to form the suspension in the presence of a stabilizing agent for the particles. The use of stabilizing agents to enhance the stability of suspended particles is known in the art. The stabilizing agent may be a cationic, anionic or nonionic surfactant. Examples of suitable surfactants include, as examples, sulfate esters, sulfonates, polyethylene glycol surfactants, phosphate esters, etc. The concentration of the stabilizer in the suspension may vary from about 1 to 50% by weight of the solids in suspension and preferably varies between about 5 and 30% by weight of the solids in suspension.

The following description illustrates the manner in which the colloid of the conductive polymer may be used in printed circuit board manufacture. For such manufacture, the substrate commonly used is an epoxy substrate filled with glass fibers and copper clad on at least one of the surfaces. As is known in the art, the epoxy may be mixed with other resins for specific purposes.

In the manufacture of a printed circuit board, a first step comprises the formation of through-holes or vias by drilling or punching or any other method known to the art. If the board is a multilayer board, following formation of the vias, it is desirable to employ the conventional step of desmearing the holes using sulfuric acid, chromic acid or an alkaline permanganate solution. Thereafter, the circuit board base material is optionally treated with a glass etch that removes glass fibers extending into the holes from the hole-walls. This is followed by a solution that cleans the copper surface and conditions the hole walls to promote catalyst adsorption. Such solutions are often referred to as cleaner-conditioners and typically comprise an aqueous surfactant solution for cleaning soil and a material carrying a charge opposite from the charge of the conductive polymer in suspension to facilitate adsorption of the suspension of the conductive polymer on the surface. Use of a cleaner-conditioner for noble metal colloids is well known in the art and it has been discovered that a number of such conditioners may be used for the suspensions of the present invention. Proprietary cleaner-conditioners are commercially available. A suitable material is available from Shipley Company Inc. of Newton, Mass. and is identified as Cleaner-Conditioner 231, an aqueous solution of a polyamine polyelectrolyte. Copper cladding should then be cleaned to remove tarnish and preferably lightly etched. Proprietary microetches are commercially available. A suitable material is available from Shipley Company Inc. and identified as Preposit Etch 748. The etch should be used at room temperature and contact with the substrate should be for a period of time ranging between about 30 seconds and 10 minutes.

Following the above preparation steps, the processing sequence of the invention may be employed. The next step in the process comprises immersion of the part to be plated in the suspension of the conductive colloid. The preferred material for purposes of the subject invention is a suspension of polypyrrole.

The treatment conditions for immersion of the substrate in the suspension of the conductive polymer are not critical provided sufficient polymer is adsorbed onto the surface to enable plating to take place. Preferably, treatment times vary from about 30 seconds to 30 minutes and more preferably, vary between about 2 and 10 minutes. The temperature of the suspension may vary from room temperature to about 150° F. Temperatures close to room temperature are preferred. Concentration of the conductive polymer in its suspension should be sufficient for formation of a coating on a substrate immersed in the suspension that is sufficiently conductive to enable the electrodeposition of metal over the coating. In general, to achieve such conductivity, the concentration of the conductive polymer in suspension may vary between about 0.1 and 30 weight percent of the suspension and more preferably, between 1.0 and 15 weight percent.

Treatment of the substrate with the suspension of the conductive polymer results in the formation of an adsorbed layer of the conductive polymer over the nonconductive surface. The conductive polymer on the dielectric is suitable for direct electroplating.

The next step in the process of the invention comprises electroplating directly over the adsorbed layer of the conductive polymer. The electroplating procedure is similar to the procedure disclosed in the above referenced U.K. patent, but careful control of the electroplating parameters as required in the U.K. patent is not necessary in the process of this invention. The electroplating process may use electroplating solutions such as those disclosed in the U.K. patent, but most commercially available electroplating solutions contain additives which make the same suitable for the process of the invention. The preferred electroplating metals in accordance with the invention are copper and nickel, though the process is suitable for electroplating of any desired metal. A typical electroplating solution comprises an aqueous acid solution of the metal desired to be plated together with proprietary additives from the group of dyes, surfactants, brighteners, leveling agents, etc. Typical acids used in the formulation of said baths comprise those with a high ionic dissociation constant for maximum conductivity such as sulfuric acid, fluoroboric acid, sulfamic acid, etc. Dyes typically used in such baths include methylene blue, methyl violet, and other n-heterocyclic compounds. Suitable surfactants included in such baths typically include nonionic surfactants such as alkyl phenoxypolyoxyethanols. Surfactants include wetting agents and water soluble organic compounds such as compounds containing multiple oxyethylene groups (polyoxyethylenes) which have been found to be effective. A preferred group of compounds include polyoxyethylene polymers having from as many as 20 to 150 repeating units. Also included in this class of materials are block copolymers of polyoxyethylene and polyoxypropylene. Typical brighteners used in such formulations include organo sulfur compounds such as mercapto propane sulfonic acid and derivatives thereof. The additives described above are added to the solution in conventional concentrations.

The electroplating procedure is conventional. The part to be plated is racked as part of a cathode in a conventional electroplating cell. Current density is conventional and varies typically within a range of from 0.5 to 5 amp per $dm^2$, dependent upon the part to be plated. For example, factors affecting current density in the plating of through hole circuit boards include the diameter of the through-holes, the thickness of the board and the composition of the electroplating solution used. The plating solution is maintained at a temperature ranging between room temperature and about 40° F.

Plating is continued for a time sufficient to form a deposit of desired thickness. For circuit board manufacture, a typical thickness may range between 10 and 50 microns, typically from 20 to 35 microns. A plating time of from 15 to 90 minutes would typically be required to obtain a deposit of the desired thickness within the preferred range of current densities. The deposit formed by the process is uniform in thickness, free of defects and strongly bonded to the surface of the nonconductor over which it is plated. Bond strength is satisfactory to withstand solder shock testing as conventionally used in printed circuit board manufacture.

The invention will be better understood by reference to the drawings and examples which follow where, unless stated otherwise, the substrate treated was a copper clad epoxide/glass circuit board base material provided with a random array of through-holes. Commercial formulations used in the examples are available from Shipley Europe Ltd. of Coventry, the United Kingdom. With specific reference to the drawing, there is shown a section of a plated through-hole of a printed circuit board formed in accordance with the invention.

EXAMPLE 1

The following example illustrates the formation of a polypyrrole suspension.

(a) A solution was formed consisting of 180 ml of deionized water, 15.72 g of sodium persulfate and 3 g of 1,5-naphthalene-disulfonic acid, disodium salt. All components were fully dissolved in solution. To this was added 20 ml of a 5 g/l aqueous solution of polyamine flocculant and the resultant solution was mixed well.

(b) Pyrrole was added dropwise to solution (a) over 90 seconds with stirring. After 1 minute, the solution began to darken indicating initiation of the polymerization reaction. The reaction was allowed to proceed for 2 hours at room temperature with stirring. At the end of this period of time, the solution was filtered, the polypyrrole precipitate rinsed with deionized water and dried in an oven at 110° C. for 60 minutes.

The polymer prepared above was then dispersed into an aqueous medium as follows.

A solution was made consisting of 0.1 g octyl phenoxy polyethoxy ethanol nonionic surfactant (TRITON×102 from Union Carbide) and 20 ml of 50% anionic phosphate ester solution (TRITON H-55 from Union Carbide). Two grams of the polypyrrole precipitate were added to the above solution and the resultant mixed for 30 minutes. Thereafter, 4 ml N-methyl pyrrolidone was added with mixing continued for 15 minutes. Finally, 26 ml of deionized water were added and the mixture stirred for an additional 3 minutes to form a stable suspension of the polypyrrole.

EXAMPLE 2

This example illustrates a single-stage method of preparing a polypyrrole suspension.

(a) To 75 ml of deionized water add (1) 5.4 g of para-toluene sulfonic acid monohydrate, (2) 2 g pyrrole and (3) 5.4 g ethylene oxide/propylene oxide copolymer nonionic surfactant (Tetronic 908 from BASF). Stir to dissolve.

(b) To 25 ml of deionized water add 6.6 g of sodium persulphate. Stir to dissolve.

(c) Add (b) to (a) slowly with stirring. The mixture will turn green then black indicating the formation of the polypyrrole.

(d) Continue stirring for 1 hour following the last addition of (b).

The conductive polymer formed in accordance with the procedures of Example 2 represents the preferred embodiment of the invention.

EXAMPLE 3

This example illustrates plating of double-sided through-hole boards using the conductive polymer suspension of Example 1.

A drilled copper clad epoxide/glass FR4 multilayer printed circuit board panel was desmeared by immersion in MLB Conditioner 211 available from Shipley Company Inc. for 5 minutes at 70° C., cold water rinsed, then alkaline permanganate solution MLB Promoter 214 available from Shipley Company Inc. for 10 minutes at 75° C., cold water rinsed, then Neutralizer 218-1 for 2 minutes at 25° C. and cold water rinsed. (All cold water rinses—2 minutes.) The so treated panel was then immersed in Cleaner Conditioner 231 available from Shipley Company Inc. [an aqueous alkaline solution consisting of a cationic polymeric surfactant]for 15 minutes at 55° C. and cold water rinsed at room temperature for 2 minutes. The panel was then immersed in a microetch available from Shipley Company Inc. identified as Microetch 748, an aqueous acidified persulfate solution, at room temperature for 30 seconds and cold water rinsed for 3 minutes. The panel was then immersed in the polymer suspension of Example 1 at room temperature for 15 minutes and cold water rinsed at room temperature for 30 seconds. The panel was then plated at room temperature at 3 amps per $dm^2$ in an acid copper electroplating solution available from Shipley Company Inc. and identified as EP-1200 for 30 minutes. The deposit was continuous over the epoxide/glass substrate in the drilled through-holes and well adhered to the hole wall surfaces.

EXAMPLE 4.

The procedure of Example 3 may be repeated using the conductive polymer formed by the procedures of Example 2 with similar results obtained.

We claim:

1. A printed circuit board having metallized through-holes providing electrical contact from one side of the board to the other, said metallized through-holes having a layer of discrete particles of a conductive polymer adsorbed from a suspension of the same disposed between the circuit board base material and the metallized surface of the through-holes.

2. The circuit board of claim 1 where the conductive polymer is selected from the group consisting essentially of polyacetylenes, polypyrroles, polyanilines and polythiophenes.

3. The method of claim 1 where the conductive polymer is a polypyrrole.

4. An article of manufacture comprising a dielectric substrate having at least a portion of its surface coated with a metal plate, said dielectric substrate and said metal plate having an intermediate layer therebetween of discrete particles of a conductive polymer adsorbed on the substrate from a suspension of the same.

5. The article of claim 4 where the conductive polymer is selected from the group consisting essentially of polyacetylenes, polypyrroles, polyanilines and polythiophenes.

6. The article of claim 4 where the conductive polymer is a polypyrrole.

* * * * *